United States Patent
Yamazaki et al.

(10) Patent No.: US 6,774,747 B2
(45) Date of Patent: *Aug. 10, 2004

(54) SURFACE ACOUSTIC WAVE DEVICE

(75) Inventors: Takashi Yamazaki, Nagano-ken (JP); Keigo Iizawa, Nagano-ken (JP); Shigeo Kanna, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/211,578

(22) Filed: Aug. 5, 2002

(65) Prior Publication Data

US 2003/0030513 A1 Feb. 13, 2003

(30) Foreign Application Priority Data

Aug. 9, 2001 (JP) .......................................... 2001-242757
May 27, 2002 (JP) .......................................... 2002-152018

(51) Int. Cl.[7] .................................................. H03H 9/00
(52) U.S. Cl. ...................... 333/195; 333/193; 310/313 A
(58) Field of Search ................................. 333/193, 195; 310/313 A (56) References Cited

U.S. PATENT DOCUMENTS

| | | | | |
|---|---|---|---|---|
| 4,232,240 A | * | 11/1980 | O'Connell | 310/313 A |
| 4,323,809 A | * | 4/1982 | O'Connell | 310/313 A |
| 5,081,389 A | * | 1/1992 | Abbott et al. | 310/313 A |
| 5,895,966 A | * | 4/1999 | Penchuk | 257/690 |
| 5,895,996 A | * | 4/1999 | Takagi et al. | 310/313 R |
| 6,163,099 A | * | 12/2000 | Kadota et al. | 310/313 A |
| 6,498,548 B2 | * | 12/2002 | Kaneda et al. | 333/195 |
| 6,545,388 B2 | * | 4/2003 | Iwamoto | 310/313 A |

FOREIGN PATENT DOCUMENTS

| | | |
|---|---|---|
| EP | 0 738 039 A1 | 10/1996 |
| JP | 02 250413 A | 10/1990 |
| JP | A-2-260908 | 10/1990 |

* cited by examiner

*Primary Examiner*—Michael Tokar
*Assistant Examiner*—Khai Nguyen
(74) *Attorney, Agent, or Firm*—Oliff & Berridge, PLC (57) ABSTRACT

The invention provides a surface acoustic wave device which uses an in-plane rotated ST cut quartz crystal plate around the Z'-axis, and which has a large reflection coefficient of the Rayleigh wave. Comb teeth-like IDT electrodes are provided and reflectors to trap the Rayleigh wave are provided on both sides of the IDT electrodes on the principal surface of the in-plane rotated ST cut quartz crystal plate. The electrode width and pitch at the IDT electrodes are defined as $L_t$, $P_t$, the width and pitch of short-circuit electrodes at the reflectors as $L_r$, $P_r$, and the thickness of the IDT electrodes and the short-circuit electrodes side as $H_t$ and $H_r$. If the electrode widths and pitches are set up so that either or both of $L_t/P_t$ and $L_r/P_r$ become $0.32\pm0.1$, this enables maximizing the reflection coefficient and achieving the miniaturization of device itself by reducing the number of the short-circuit electrodes.

6 Claims, 7 Drawing Sheets

| η \ H/λ | 0.02 | 0.03 | 0.04 | 0.05 | 0.06 | 0.07 | 0.08 |
|---|---|---|---|---|---|---|---|
| 0.2 | 0.004785 | 0.007209 | 0.009470 | 0.011302 | 0.012336 | 0.011878 | 0.008484 |
| 0.3 | 0.005493 | 0.008313 | 0.011100 | 0.013448 | 0.014786 | 0.014254 | 0.010544 |
| 0.4 | 0.005476 | 0.007967 | 0.010358 | 0.012250 | 0.013006 | 0.011746 | 0.007600 |
| 0.5 | 0.004903 | 0.006597 | 0.007903 | 0.008501 | 0.007854 | 0.005527 | 0.004920 |

SURFACE ACOUSTIC WAVE DEVICE

BACKGROUND OF THE INVENTION

1. Field of Invention

The present invention relates to a surface acoustic wave device which further reduces the fluctuation of frequency to temperature change by using an in-plane rotated ST cut quartz crystal plate around the Z'-axis (hereinafter "in-plane rotated ST cut quartz crystal plate").

2. Description of Related Art

Related art surface acoustic wave devices exist in which IDT (Interdigital Transducer) electrodes are provided on the principal surface of a piezoelectric flat plate represented by a quartz crystal sheet, and multiple reflectors are provided at both ends of the IDT electrodes to oscillate a high frequency stably (hereinafter "SAW resonator").

An ST cut SAW resonator can be provided in which an ST cut quartz crystal plate is used as a piezo-electric flat plate to reduce the fluctuation of frequency to temperature change, and the X-axis direction of the ST cut quartz crystal plate is taken as the propagation direction of the acoustic wave.

Figure 6:
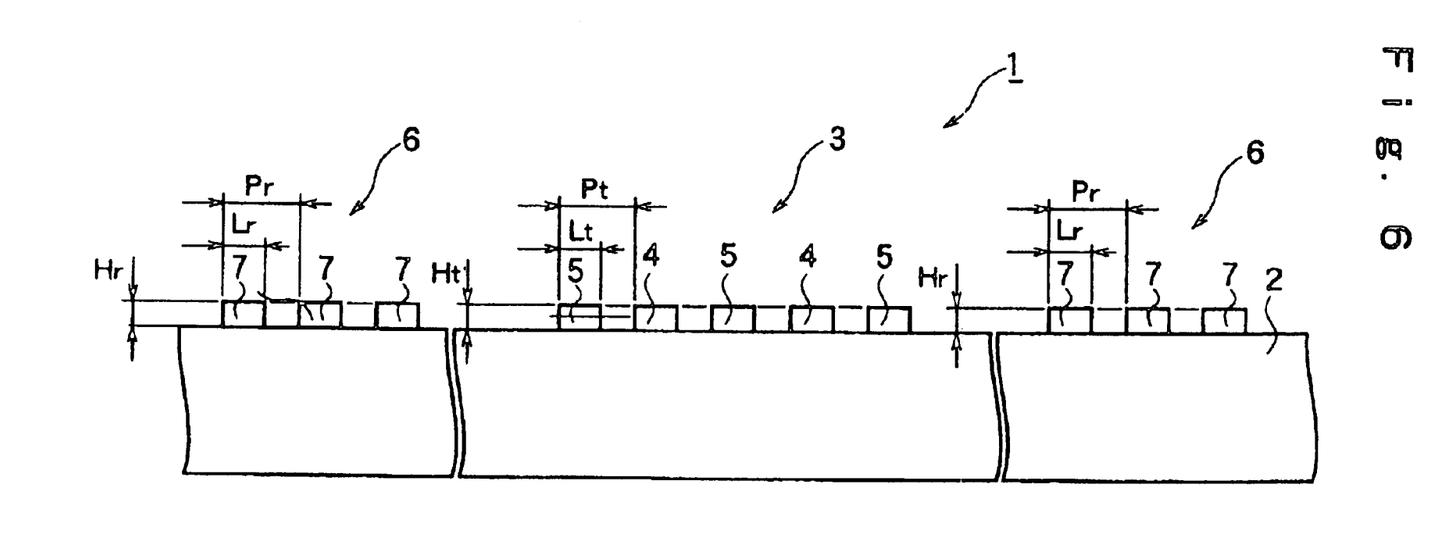
FIG. 6 is a schematic sectional view showing the structure of an ST cut SAW resonator.

FIG. 6 is a schematic sectional view showing the structure of an ST cut SAW resonator. As shown in FIG. 6, in the ST cut SAW resonator 1, an ST cut quartz crystal plate 2 is taken as the substrate, and IDT electrodes 3 are provided on the principal surface of the substrate. Comb teeth-like anodes 4 and cathodes 5 are alternately arranged in the IDT electrodes 3, and a surface acoustic wave is excited due to the piezoelectric effect of the quartz crystal plate by adding a high-frequency electric field between the anodes 4 and cathodes 5.

Multiple reflectors 6 are provided on both sides of the IDT electrodes 3 to reflect the surface acoustic wave, and the reflection of the surface acoustic wave emitted from the IDT electrodes 3 is performed by multiple short-circuit electrodes 7 formed in the reflectors 6. The anodes 4 and cathodes 5 in the IDT electrodes 3 and the short-circuit electrodes 7 in the reflectors 6 are arrayed in the X-axis direction of the ST cut quartz crystal plate 2, and the reflection of the surface acoustic wave in the short-circuit electrodes 7 is performed at positions of both edges of the electrodes.

In the ST cut SAW resonator 1 thus constructed, as shown in FIG. 6, the width and the pitch of the anodes 4 and cathodes 5 in the IDT electrodes 3 are defined as $L_t$, $P_t$, and the width and the pitch of the short-circuit electrodes 7 in the reflectors 6 are defined as $L_r$, $P_r$. The thickness of the anodes 4 and cathodes 5 is defined as $H_t$, and the thickness of the short-circuit electrodes 7 is defined as $H_r$.

Figure 7:
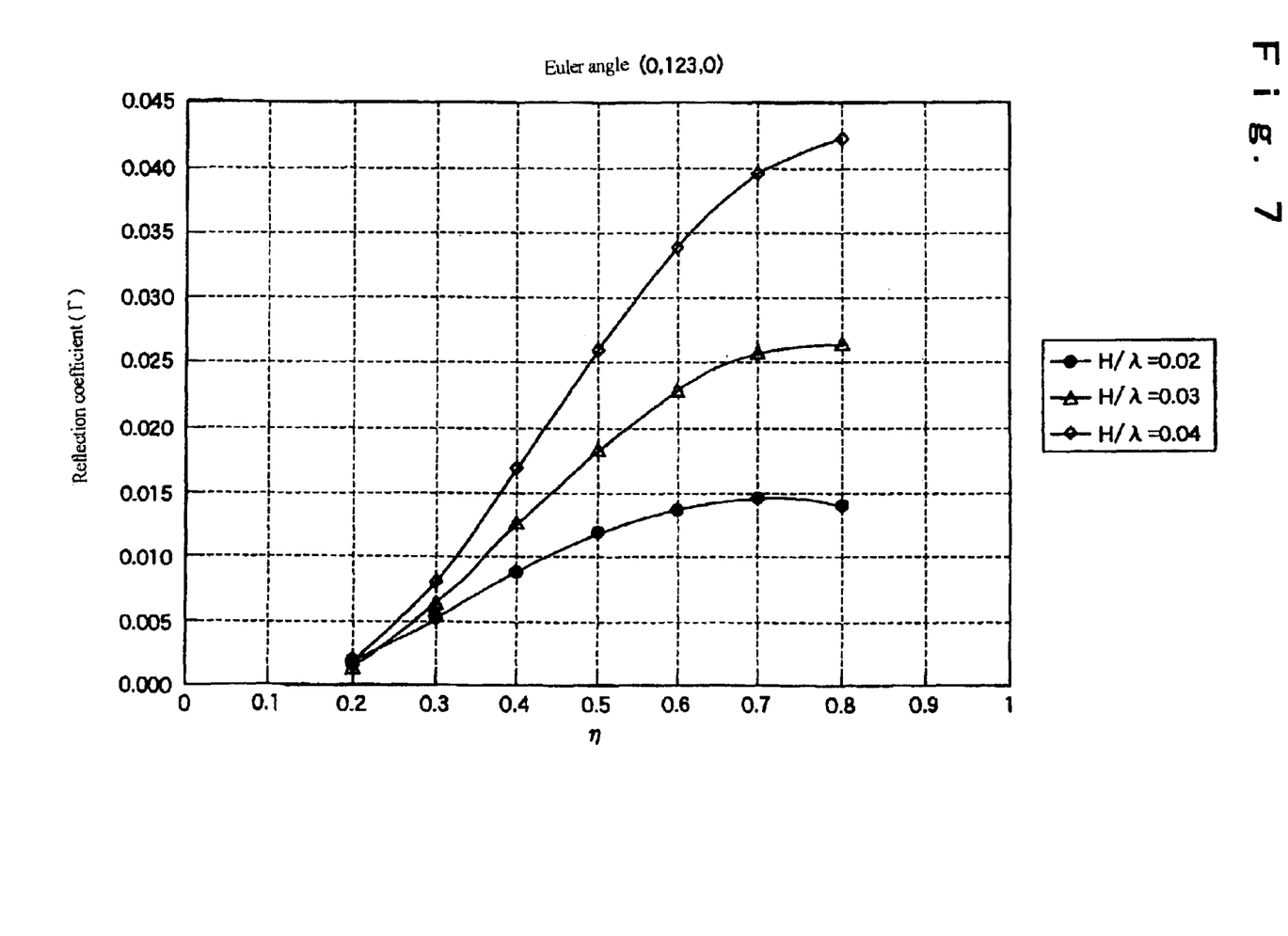
FIG. 7 is a graph showing reflection coefficient per short-circuit electrode of an ST cut SAW resonator.

FIG. 7 is a graph showing the reflection coefficient per short-circuit electrode of the ST cut SAW resonator. In the ST cut SAW resonator 1, if the reflection coefficient of a surface acoustic wave can be increased, it is possible to reduce the number of reflectors 6 and to miniaturize the resonator itself. FIG. 7 shows the value of $L_t/P_t$ (hereinafter "$L_r/P_r$," is referred to as "$\eta$") on the horizontal axis, and shows the reflection coefficient per short-circuit electrode on the vertical axis, and shows how the reflection coefficient fluctuates with the value of the $H_t/2P_t (\cong H_r/2P_r)$.

When the reflection coefficient is considered, the $H_t/2P_t$ and $H_r/2P_r$ can be regarded as nearly the same value. $2P_t$ and $2P_r$ are nearly the same value, so $2P_t$ and $2P_r$ are defined as $\lambda$. Therefore, in the present embodiment, $H_t/2P_t$ and $H_r/2P_r$ are not distinguished and are treated as the same value, i.e., $H/\lambda$.

As shown in FIG. 7, for the ST cut SAW resonator 1, the reflection coefficient also increases with an increase in the $\eta$ value, and the higher the H/λ value, the greater the reflection coefficient for the relationship of H/λ and reflection coefficient, as disclosed in Japanese Laid-Open Patent Application H2-260908.

In the ST cut SAW resonator 1, the thickness (H) of the anodes 4, cathodes 5 and short-circuit electrodes 7 is commonly set up so that the H/λ values become about 0.03 from a viewpoint of obtaining objective temperature characteristics. The $\eta$ value is set to 0.5, so that a relation of $P_t = 2L_t$ is established.

In the SAW resonator, a quartz crystal plate cut from the in-plane rotated ST cut quartz crystal plate around the Z'-axis is sometimes used to further reduce the frequency fluctuation caused by temperature change. However, the relationship between the $\eta$, H/λ value and the reflection coefficient have not yet been verified with the in-plane rotated ST cut quartz crystal plate around the Z'-axis.

SUMMARY OF THE INVENTION

The inventors studied the in-plane rotated ST cut quartz crystal plate around the Z'-axis, and discovered that it has characteristics quite different from a related art ST cut quartz crystal plate, and a regularity of the related art ST cut quartz crystal plate in which the reflection coefficient is increased by increasing the $\eta$ and H/λ values does not apply. Therefore, a problem arises that the reflection coefficient cannot be fully obtained, even if the regularity of the related art ST cut quartz crystal plate is applied to the in-plane rotated ST cut quartz crystal plate around the Z'-axis to increase the $\eta$ and H/λ values.

The present invention addresses the above problem, and provides a surface acoustic wave device which enables the reflection coefficient to be increased by grasping the characteristics of the in-plane rotated ST cut quartz crystal plate around the Z'-axis.

The present invention was discovered via various studies and the knowledge that the characteristics of the ST cut quartz crystal plate in a plane rotated around the Z'-axis differ from the characteristics of a related art ST cut quartz crystal plate.

Namely, the surface acoustic wave device relating to the present invention has one or more pairs of IDT electrodes to excite a Rayleigh wave arranged on a principal surface of an in-plane rotated ST cut quartz crystal plate and existing at a Euler angle (0, 113–135,±(40–49)), and the ratio $L_t/P_t$ of width $L_t$ of the IDT electrodes to pitch $P_t$ of the IDT electrodes is less than 0.5. It is desirable that the $L_t/P_t$ be 0.32±0.1, and it is further desirable that the thickness of the IDT electrodes be taken as $H_t$ and the $H_t/2P_t$ be 0.06±0.01.

Another surface acoustic wave device relating to the present invention has one or more pairs of IDT electrodes to excite a Rayleigh wave, and one or more reflectors to trap the Rayleigh wave arranged on the principal surface of the in-plane rotated ST cut quartz crystal plate existing at a Euler angle (0, 113–135,±(40–49)), and either or both of the ratio $L_t/P_t$ of width $L_t$ of the IDT electrodes to pitch $P_t$ in the IDT electrodes and the ratio $L_r/P_r$ of width $L_r$ of the reflector to pitch $P_r$ in the reflectors are less than 0.5.

It is desirable that either or both of the $L_t/P_t$ and the $L_r/P_r$ be 0.32±0.1, and it is further desirable that the thickness of the IDT electrodes be taken as $H_t$ and the thickness of the reflectors be taken as $H_r$, and either or both of $H_t/2P_t$ and $H_r/2P_r$ be 0.06±0.01 in another surface acoustic wave device relating to the present invention.

Thus, an acoustic wave device which has an in-plane rotated ST cut quartz crystal plate around the Z'-axis is different from a surface acoustic wave device to which a related art ST cut quartz crystal plate is applied. If the $L_t/P_t$ value in the IDT electrodes is decreased, the value of reflection coefficient is enhanced.

More specifically, it is desirable that the $L_t/P_t$ value be less than the $L_t/P_t$ value (0.5) generally applied to a related art surface acoustic wave device to which a related art ST cut quartz crystal plate is applied. Thus, setting the $L_t/P_t$ value to be less than 0.5, enables the value of reflection coefficient to be enhanced and miniaturization of the device itself to be achieved.

Setting the $L_r/P_r$ value of reflectors provided to be adjacent to the IDT electrodes to be less than 0.5 like $L_t/P_t$, enables the value of the reflection coefficient to be enhanced and promotes miniaturization of the device itself, in addition to the above effect. If both the value of $L_t/P_t$ and the value of $L_r/P_r$ are set to be less than 0.5, the value of reflection coefficient can be further enhanced, but the enhancement of the value of reflection coefficient can certainly be sought, even if either one of the value of $L_t/P_t$ and value of $L_r/P_r$ is set to be less than 0.5.

According to investigations of the inventors, setting either one or both of $L_t/P_t$ and $L_r/P_r$ to 0.32±0.1, and further setting either one or both of $H_t/2P_t$ and $H_r/2P_r$ to 0.06±0.01, enables the value of the reflection coefficient to be further enhanced, and miniaturization of device itself to be achieved.

BRIEF DESCRIPTION OF THE DRAWINGS

FIGS. 5(1) and 5(2) show the relationship of reflection coefficient versus fluctuation of H/λ in surface acoustic wave device according to an exemplary embodiment of the invention, where FIG. 5(1) is a table of calculation results, and FIG. 5(2) is a graph made from the calculation results in FIG. 5(1);

DETAILED DESCRIPTION OF PREFERRED EMBODIMENTS

A specific embodiment of the surface acoustic wave device relating to an exemplary embodiment of the invention is described in detail hereafter, with reference to the drawings below.

Figure 1:
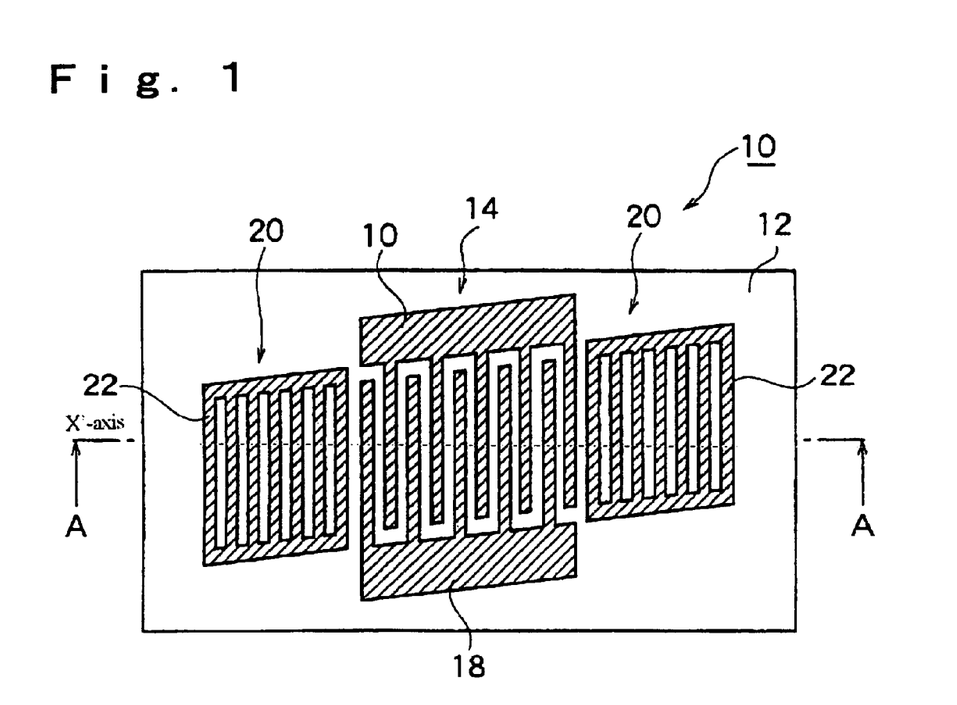
FIG. 1 is a schematic front view of a surface acoustic wave device according to an exemplary embodiment of the present invention.
Figure 2:
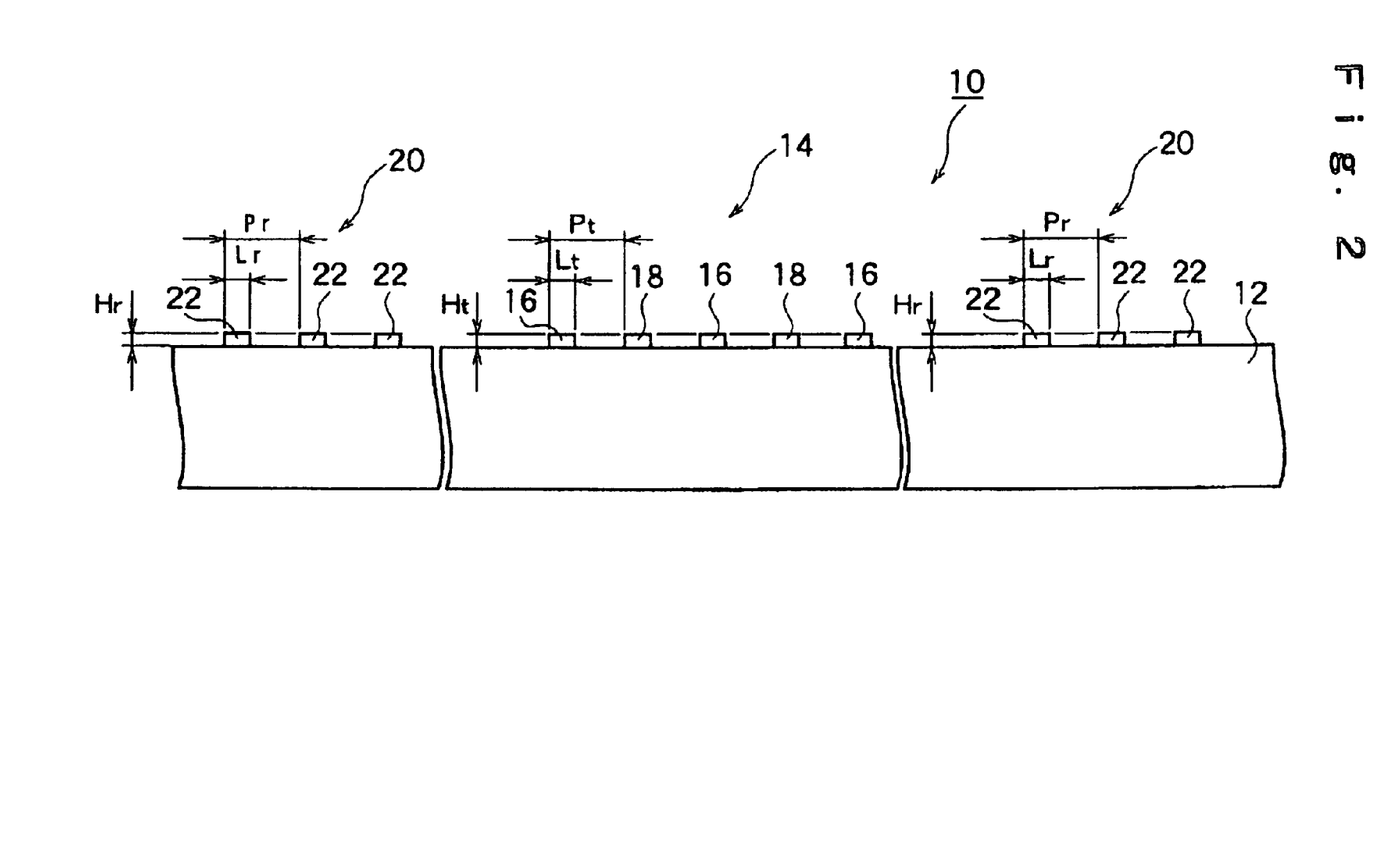
FIG. 2 is a schematic sectional view taken along plane A—A of FIG. 1.

FIG. 1 is a schematic front view of a surface acoustic wave device relating to the present embodiment, and FIG. 2 is a sectional view taken along plane A—A of FIG. 1.

As shown in FIGS. 1 and 2, in a surface acoustic wave device 10 which becomes an SAW resonator relating to the exemplary embodiment, the in-plane rotated ST cut quartz crystal plate 12 around the Z'-axis (hereinafter "in-plane rotated ST cut quartz crystal plate 12") is prepared as a base substrate. Then, an IDT electrode 14 is provided in the central area of the surface at in the in-plane rotated ST cut quartz crystal plate 12. The IDT electrode 14 includes one pair of anode electrodes 16 and cathode electrodes 18 including comb teeth, and the IDT electrode 14 is constructed by arranging the comb teeth alternately and in parallel at these two electrodes. Thus, a surface acoustic wave is excited due to the piezoelectric effect of the in-plane rotated ST cut quartz crystal plate 12 by arranging the anode electrodes 16 and the cathode electrodes 18 alternately on the principal surface of the in-plane rotated ST cut quartz crystal plate 12, and applying a high-frequency electric field between the two electrodes.

Multiple reflectors 20 are provided on both sides of the IDT electrode 14 on the principal surface of the in-plane rotated ST cut quartz crystal plate 12. The reflectors 20 take a form of parallel multiple short-circuit electrodes 22 having a given width, and the reflection of Rayleight wave in the surface acoustic wave generated by the IDT electrodes 14 is performed by the multiple short-circuit electrodes 22.

The anode electrodes 16 and the cathode electrodes 18 in the IDT electrodes, 14 as well as the short-circuit electrodes 22 in the reflectors 20, are arrayed in the X'-axis direction at the in-plane rotated ST cut quartz crystal plate 12, and the reflection of Rayleight wave caused by the short-circuit electrodes 22 is performed in positions of both edges of electrodes.

In the surface acoustic wave device 10 using the in-plane rotated ST cut quartz crystal plate 12, as shown in FIG. 2, the width and the pitch of the anode electrodes 16 and the cathode electrodes 18 in the IDT electrode 14 are defined as $L_t$, $P_t$, the width and the pitch of the short-circuit electrodes 22 are defined as $L_r$, $P_r$, the thickness of the anode electrodes 16 and the cathode electrodes 18 is defined as $H_t$, and the thickness of short-circuit electrodes 22 is defined as $H_r$.

Figure 3:
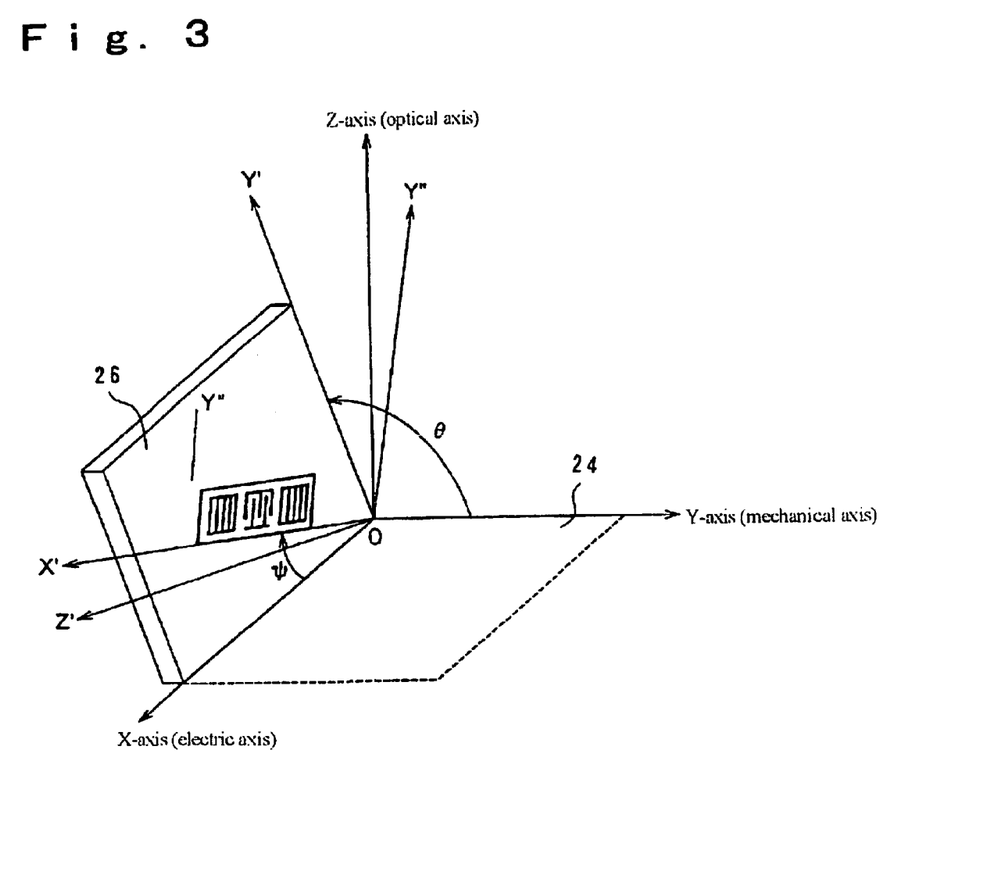
FIG. 3 is a schematic of the in-plane rotated ST cut quartz crystal plate around the Z'-axis.

The in-plane rotated ST cut quartz crystal plate 12 used in the surface acoustic wave device 10 is described below. FIG. 3 is a schematic of the in-plane rotated ST cut quartz crystal plate around the Z'-axis.

As shown in FIG. 3, the crystal axis of quartz is defined as the electric axis (X-axis), mechanical axis (Y-axis) and optical axis (Z-axis). A quartz crystal plate referred to as "an ST cut" is cut off along new coordinate axes (X, Y', Z') of a quartz crystal plate 26 obtained by rotating a quartz crystal Z plate 24 with an Euler angle (φ, θ, ψ)=(0, 0, 0) by θ=113–135° around the electric axis (X-axis). A piezoelectric substrate, which is prepared by further rotating the quartz crystal plate by ψ=±(40–49) degree around the Z'-axis of the quartz crystal plate 26, so that the propagation direction of the surface acoustic wave becomes the direction of X'-axis defined by ψ, is referred to the in-plane rotated ST cut quartz crystal plate 12 around the Z'-axis. This in-plane rotated ST cut quartz crystal plate 12 has extremely small frequency change to temperature change.

The inventors have also discovered that the reflection coefficient in the surface acoustic wave device 10 using the in-plane rotated ST cut quartz crystal plate 12 is different from the surface acoustic wave device using the related art ST cut quartz crystal resonator.

Figure 4:
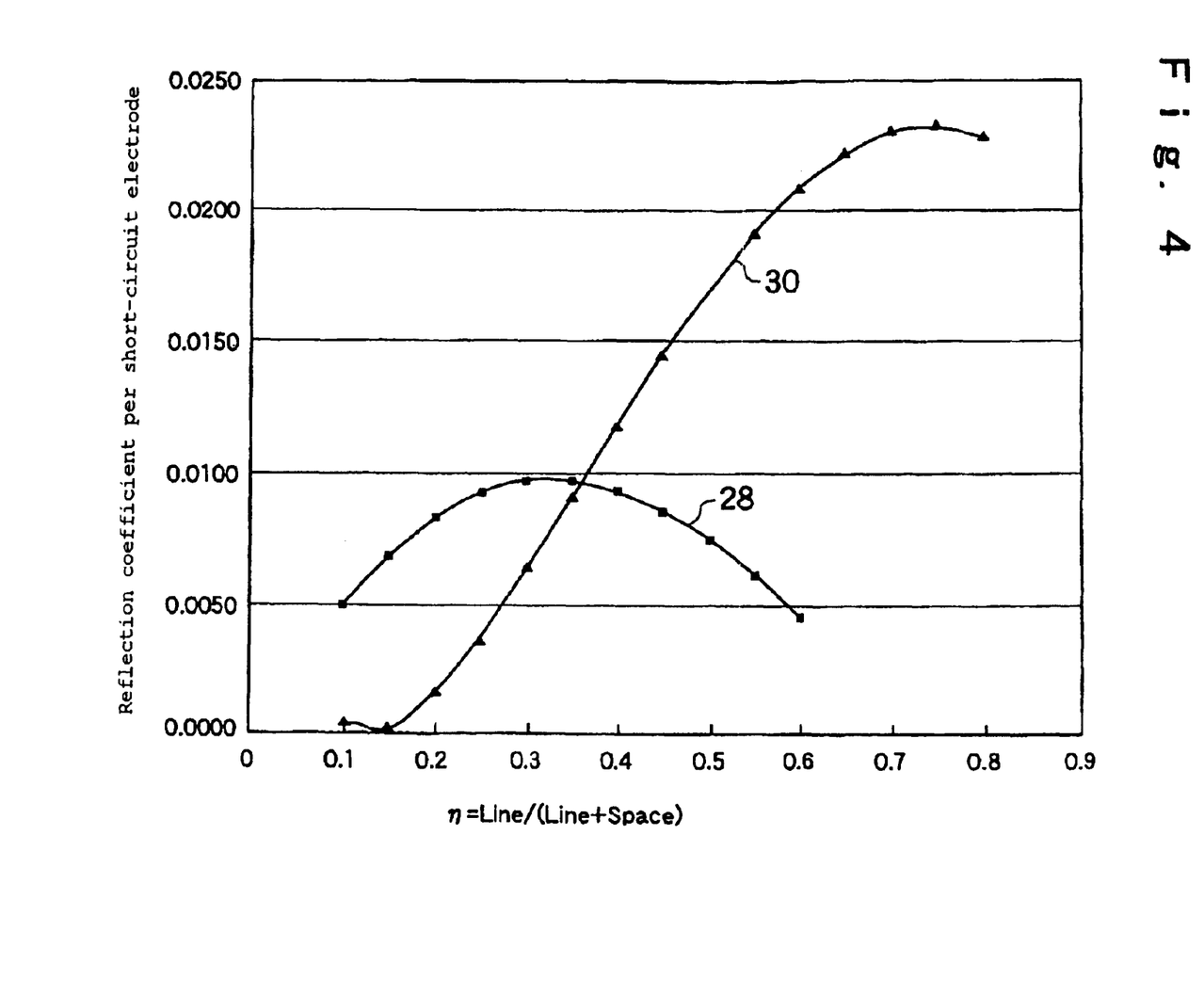
FIG. 4 is a graph for comparing reflection coefficients of surface acoustic wave device relating to an exemplary embodiment of the invention and a related art surface acoustic wave device.
Figure 5:
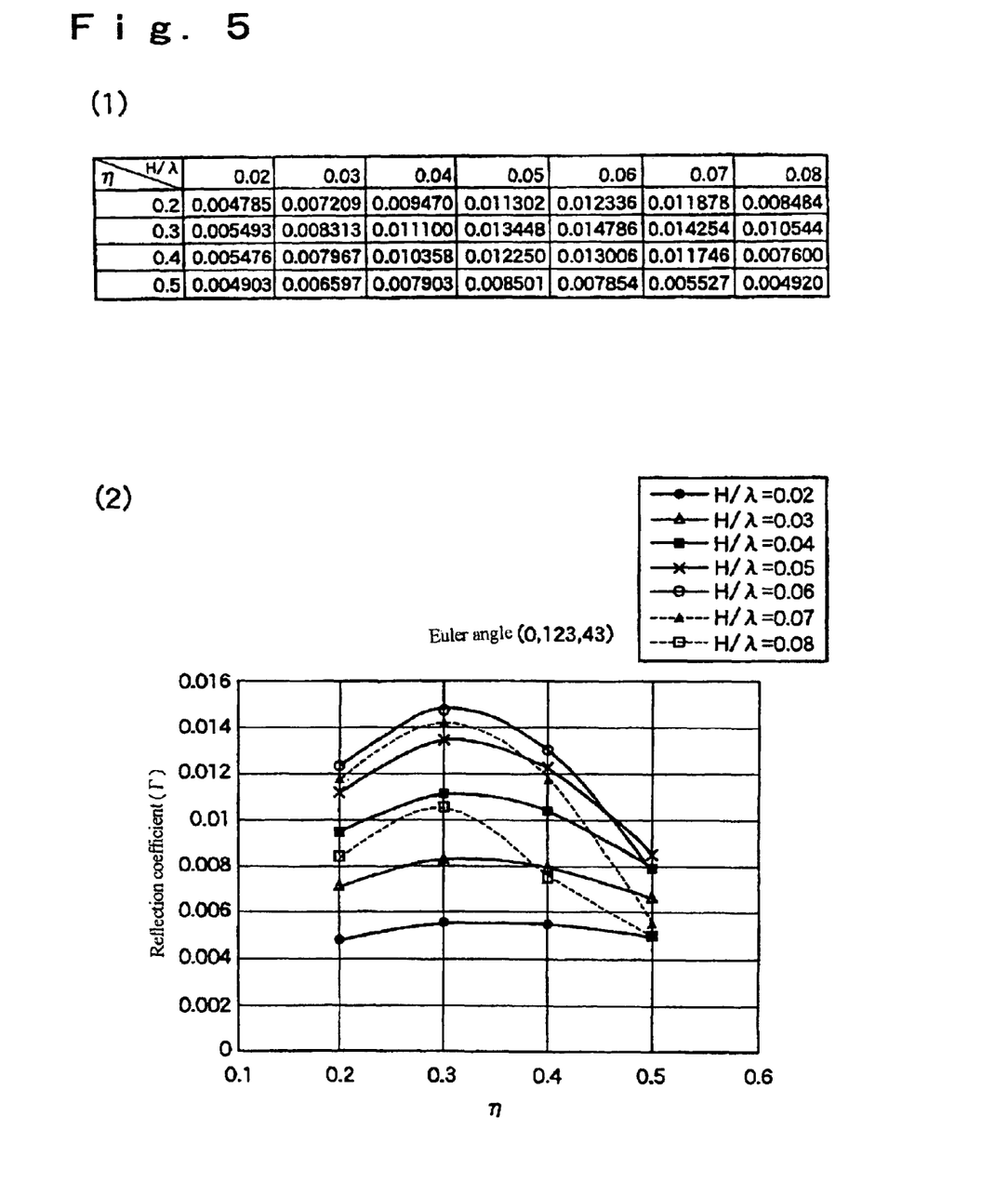

FIG. 4 is a graph that compares the reflection coefficients of the surface acoustic wave device relating to the present embodiment and a related art surface acoustic wave device. In FIG. 4, the value of $L_t/P_t$ (hereinafter "$L_r/P_r$" is referred to as "η") is shown in the horizontal axis and the reflection coefficient per short-circuit electrode is shown in the vertical axis.

Details of the in-plane rotated ST cut quartz crystal plate of the surface acoustic wave device relating to the present embodiment are set such that: θ=133°, ψ=43.4° and H/λ= 0.035. On the other hand, details of the ST cut quartz crystal plate of the related art surface acoustic wave device are set such that: θ=133°, ψ=0° and H/λ=0.03.

Characteristics of the surface acoustic wave device relating to the present embodiment thus set up are shown by the first line 28, and characteristics of the related art surface acoustic wave device are shown by the second line 30. The characteristics of the related art surface acoustic wave device shown by the second line 30 indicate a tendency that the value of reflection coefficient increases with increasing the η value. By contrast, in the device relating to the present embodiment shown by the first line 28, it is not confirmed that the value of reflection coefficient increases with increasing the η value as shown by above second line 30, and it is understandable that the value of reflection coefficient becomes a maximum when the η value is in the vicinity of 0.3, and decreases the η value whether it is greater or smaller than this value.

FIGS. 5(1) and 5(2) show a relationship of reflection coefficient to fluctuation of H/λ in the surface acoustic wave device relating to the present invention, where FIG. 5(1) is a table of calculation results, and FIG. 5(2) is a graph made from the calculation results in FIG. 5(1). The η value from the data shown in FIG. 5(1) are obtained from the fact that the optimum value from the average of η values maximizing the reflection coefficient at each H/λ value is 0.32. Moreover, electrodes are more micro-fined in the surface acoustic wave device to obtain a high resonance frequency, and therefore errors relative to the electrode width of manufacture dispersion increases. As a present manufacturing error, for example, if the sound speed is taken as 3,250 m/sec, the pitch $P_t$ at an oscillation frequency zone of about 1 GHz is about 1.625 μm, and the manufacturing dispersion of electrode width at this time is about ±0.16 μm. It becomes ±0.1 if converted to η.

Accordingly, it was found that the reflection coefficient becomes a maximum value when the η of the in-plane rotated ST cut quartz crystal plate 12 is in the range of 0.32±0.1.

From the above, setting the electrode widths and the pitches of the IDT electrodes 14 and reflectors 20 or either one thereof in the range where the η values are 0.32±0.1 in the surface acoustic wave device 10 using the in-plane rotated ST cut quartz crystal plate 12, enables the reflection coefficient to be enhanced, the electrode number of the short-circuit electrodes 22 to be decreased, and the surface acoustic wave device 10 to be miniaturized.

FIG. 4 shows that a range of η which maximizes the reflection coefficient exists in a surface acoustic wave device 10 using the in-plane rotated ST cut quartz crystal plate 12. However, FIG. 5 shows that the reflection coefficient is enhanced by not only the η values but also the fluctuation of the H/λ values.

Namely, in FIGS. 5(1) and 5(2), the in-plane rotated ST cut quartz crystal plate of the surface acoustic wave device relating to the present embodiment are set to θ=123°, ψ=43° and divided into 7 stages between H/λ value=0.02–0.08, and the value of the reflection coefficient is shown for each H/λ value. However, as shown in FIG. 5(2), it is clarified that the value of reflection coefficient is maximized when the H/λ value is 0.06, and the value of reflection coefficient decreases in case that the H/λ deviates from this value.

Moreover, it is clarified from FIGS. 5(1) and 5(2) that the reflection coefficient is the maximum at H/λ=0.06, even if the H/λ values maximizing the reflection coefficient at η=0.2, 0.3 and 0.4 calculated to their mean value are taken. Furthermore, it is clarified from FIG. 5(2) that a decrease of reflection coefficient is large in the range where the H/λ is more than 0.06±0.01. Therefore, the H/λ=0.06±0.01 is also the optimum value.

It was confirmed that the value of reflection coefficient also increases with an increase in the H/λ value in the surface acoustic wave device using a related art ST cut quartz crystal plate. However, as shown in the graph of FIG. 5(2), it was clarified by the investigation of inventors that the reflection characteristics of the surface acoustic wave device using the in-plane rotated ST cut quartz crystal plate are markedly different from those of a related art ST cut quartz crystal plate, even though the related art ST cut quartz crystal plate is in a plane which is simply rotated.

Thus, from the results shown in FIGS. 5(1) and 5(2), setting the electrode thickness of the IDT electrodes 14 and reflectors 20 or either one thereof in the range where the H/λ values are 0.06±0.01 in the surface acoustic wave device 10 using the in-plane rotated ST cut quartz crystal plate 12, enables the reflection coefficient to be enhanced, the electrode number of the short-circuit electrodes 22 to be decreased, and the surface acoustic wave device 10 to be miniaturized.

Then, if the design guidance is in agreement with the above-mentioned η value maximizing the reflection coefficient (0.32±0.1) in addition to the optimum range of above-mentioned H/λ value, the reflection coefficient can be farther increased.

As described above, the present invention enables the reflection coefficient of the Rayleigh wave to be increased, even if the in-plane rotated ST cut quartz crystal plate around the Z'-axis is used in a surface acoustic wave device, and thereby enables the fluctuation of frequency to temperature change to be farther reduced, and the device itself to be miniaturized. Because the present invention is a surface acoustic wave device having one or more pairs of IDT electrodes to excite a Rayleigh wave arranged on the principal surface of the in-plane rotated ST cut quartz crystal plate existing at a Euler angle (0, 113–135, ±(40–49)), the ratio $L_t/P_t$ of width of the IDT electrodes to pitch $P_t$ of the IDT electrodes is less than 0.5, a surface acoustic wave device having one or more pairs of IDT electrodes to excite a Rayleigh wave and one or more reflectors to trap the Rayleigh wave arranged on the principal surface of the in-plane rotated ST cut quartz crystal plate existing at a Euler angle (0, 113–135, ±(40–49)) and either or both of the ratio $L_t/P_t$ of width $L_t$ of the IDT electrodes to pitch $P_t$ in the IDT electrodes and the ratio $L_r/P_r$ of width $L_r$ of the reflector to pitch $P_r$ in the reflector are less than 0.5.

What is claimed is:

1. A surface acoustic wave device, comprising:
   an in-plane rotated ST cut quartz crystal plate having a principal surface; and
   at least one pair of IDT electrodes to excite a Rayleigh wave arranged on the principal surface of the in-plane rotated ST cut quartz crystal plate existing at a Euler angle (0, 113–135, ±(40–49)), a ratio $L_t/P_t$ of width $L_t$ of the IDT electrodes to pitch $P_t$ of the IDT electrodes being less than 0.5.

2. The surface acoustic wave device according to claim 1, the $L_t/P_t$ being 0.32±0.1.

3. The surface acoustic wave device according to claim 1, a thickness of the IDT electrodes being taken as $H_t$, and the $H_t/2P_t$ being 0.06±0.01.

4. A surface acoustic wave device, comprising:

an in-plane rotated ST cut quartz crystal plate having a principal surface;

at least one pair of IDT electrodes to excite a Rayleigh wave; and at least one reflector to trap a Rayleigh wave arranged on the principal surface of the in-plane rotated ST cut quartz crystal plate existing at a Euler angle (0, 113–135, ±(40–49)), at least one of a ratio $L_t/P_t$ of width $L_t$ of the IDT electrodes to pitch $P_t$ in the IDT electrodes and a ratio $L_r/P_r$ of width $L_r$ of the reflectors to pitch $P_r$ in the reflectors being less than 0.5.

5. The surface acoustic wave device according to claim 4, at least one of the $L_t/P_t$ and the $L_r/P_r$ being 0.32±0.1.

6. The surface acoustic wave device according to claim 4, a thickness of the IDT electrodes being taken as $H_t$ and a thickness of the reflectors being taken as $H_r$, and at least one of $H_t/2P_t$ and $H_r/2P_r$ being 0.06±0.01.

* * * * *